(12) United States Patent
Huang et al.

(10) Patent No.: US 11,063,148 B2
(45) Date of Patent: Jul. 13, 2021

(54) HIGH VOLTAGE DEPLETION MODE MOS DEVICE WITH ADJUSTABLE THRESHOLD VOLTAGE AND MANUFACTURING METHOD THEREOF

(71) Applicant: RICHTEK TECHNOLOGY CORPORATION, Hsinchu (TW)

(72) Inventors: Tsung-Yi Huang, HsinChu (TW); Ching-Yao Yang, Hsinchu (TW)

(73) Assignee: RICHTEK TECHNOLOGY CORPORATION, Hsinchu (TW)

( * ) Notice: Subject to any disclaimer, the term of this patent is extended or adjusted under 35 U.S.C. 154(b) by 363 days.

(21) Appl. No.: 15/909,277

(22) Filed: Mar. 1, 2018

(65) Prior Publication Data

US 2018/0315851 A1    Nov. 1, 2018

(30) Foreign Application Priority Data

Apr. 27, 2017 (TW) .................................. 106114092

(51) Int. Cl.
| | | |
|---|---|---|
| *H01L 21/8234* | (2006.01) | |
| *H01L 21/761* | (2006.01) | |
| *H01L 29/78* | (2006.01) | |
| *H01L 29/66* | (2006.01) | |

(Continued)

(52) U.S. Cl.
CPC ........ *H01L 29/7838* (2013.01); *H01L 21/761* (2013.01); *H01L 21/82345* (2013.01); *H01L 21/823481* (2013.01); *H01L 27/088* (2013.01); *H01L 29/66659* (2013.01);
(Continued)

(58) Field of Classification Search
CPC .......... H01L 29/7835; H01L 29/66659; H01L 29/78624; H01L 29/66681; H01L 29/7816; H01L 21/8236; H01L 21/823412; H01L 29/66537; H01L 29/1083; H01L 29/7838; H01L 27/0883; H01L 21/761; H01L 21/823481
See application file for complete search history.

(56) References Cited

U.S. PATENT DOCUMENTS 4,924,277 A * 5/1990 Yamane .............. H01L 27/0928
257/338
5,122,474 A * 6/1992 Harrington, III ..........................
H01L 21/823807
257/E21.433

(Continued)

*Primary Examiner* — Mohsen Ahmadi
(74) *Attorney, Agent, or Firm* — Tung & Associates

(57) ABSTRACT

A high voltage depletion mode MOS device with adjustable threshold voltage includes: a first conductive type well region; a second conductive type channel region, wherein when the channel region is not depleted, the MOS device is conductive, and when the channel region is depleted, the MOS device is non-conductive; a second conductive type connection region which contacts the channel region; a first conductive type gate, for controlling the conductive condition of the MOS device; a second conductive type lightly doped diffusion region formed under a spacer layer of the gate and contacting the channel region; a second type source region; and a second type drain region contacting the connection region but not contacting the gate; wherein the gate has a first conductive type doping or both a first and a second conductive type doping, and wherein a net doping concentration of the gate is determined by a threshold voltage target.

7 Claims, 14 Drawing Sheets

(51) Int. Cl.
*H01L 29/423* (2006.01)
*H01L 27/088* (2006.01)
(52) U.S. Cl.
CPC ...... *H01L 29/7816* (2013.01); *H01L 29/7835* (2013.01); *H01L 29/42368* (2013.01)

(56) References Cited

U.S. PATENT DOCUMENTS

| | | | | |
|---|---|---|---|---|
| 5,923,984 A * | 7/1999 | Gardner | ............. | H01L 27/0883 257/E21.623 |
| 6,184,055 B1 * | 2/2001 | Yang | ................... | H01L 27/1443 257/233 |
| 8,143,130 B1 * | 3/2012 | Huang | ........... | H01L 21/823412 257/402 |
| 8,581,716 B2 * | 11/2013 | Wright | .................... | B60Q 1/52 340/436 |
| 10,490,438 B2 * | 11/2019 | Tomino | ............. | H01L 21/76224 |
| 2002/0123167 A1 * | 9/2002 | Fitzgerald | ......... | H01L 21/02381 438/47 |
| 2005/0051814 A1 * | 3/2005 | Miyake | ........... | H01L 21/823425 257/288 |
| 2006/0275990 A1 * | 12/2006 | Itonaga | ............... | H01L 29/6656 438/286 |
| 2008/0272442 A1 * | 11/2008 | Venugopal | ...... | H01L 21/823807 257/402 |
| 2009/0179272 A1 * | 7/2009 | Campi, Jr. | .......... | H01L 29/1083 257/365 |
| 2010/0252880 A1 * | 10/2010 | Stribley | ................ | H01L 21/266 257/335 |
| 2011/0039378 A1 * | 2/2011 | Voidman | ........... | H01L 29/66659 438/200 |
| 2011/0121404 A1 * | 5/2011 | Shifren | ........... | H01L 21/823412 257/392 |
| 2011/0133273 A1 * | 6/2011 | Shima | ................. | H01L 29/0847 257/336 |
| 2011/0207278 A1 * | 8/2011 | Shibata | ............... | H01L 27/0883 438/277 |
| 2012/0319189 A1 * | 12/2012 | Wang | .................. | H01L 27/0251 257/328 |
| 2014/0179079 A1 * | 6/2014 | Huang | ............. | H01L 29/66681 438/286 |
| 2014/0306319 A1 * | 10/2014 | Torii | ............... | H01L 21/823857 257/547 |
| 2014/0312429 A1 * | 10/2014 | Bramian | ............. | H01L 21/8258 257/392 |
| 2015/0008518 A1 * | 1/2015 | Nandakumar | .. | H01L 21/823412 257/336 |
| 2015/0102405 A1 * | 4/2015 | Ryu | .................. | H01L 29/42368 257/336 |
| 2015/0200295 A1 * | 7/2015 | Prabhakar | ........... | H01L 29/7835 257/344 |
| 2015/0255475 A1 * | 9/2015 | Tomino | ............. | H01L 27/11529 257/314 |
| 2016/0187414 A1 * | 6/2016 | Lin | ..................... | H01L 27/0886 324/719 |
| 2017/0229575 A1 * | 8/2017 | Chu | .................... | H01L 29/7835 |

* cited by examiner

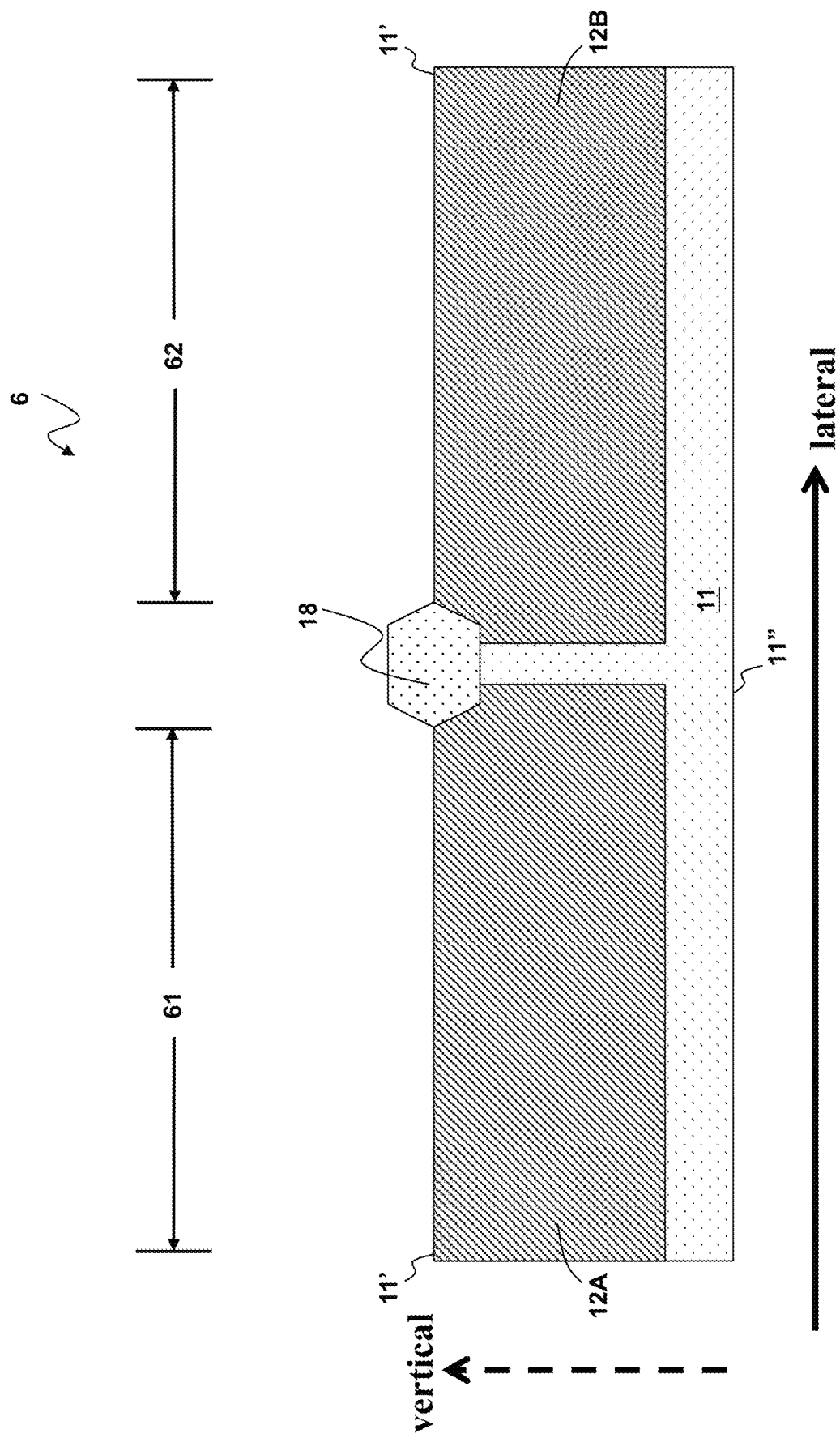

HIGH VOLTAGE DEPLETION MODE MOS DEVICE WITH ADJUSTABLE THRESHOLD VOLTAGE AND MANUFACTURING METHOD THEREOF

CROSS REFERENCE

The present invention claims priority to Taiwan 106114092, filed on Apr. 27, 2017.

BACKGROUND OF THE INVENTION

Field of Invention

The present invention relates to a high voltage depletion mode Metal Oxide Semiconductor (MOS) device; particularly it relates to a high voltage depletion mode MOS device having an adjustable threshold voltage. The present invention also relates to a manufacturing method of the high voltage depletion mode MOS device.

Description of Related Art

MOS devices of a same conductive type but with different threshold voltages are usually required in designing high voltage circuits such as power regulators. FIG. 1 shows a prior art high voltage combo MOS device (MOS device 1). The MOS device 1 includes MOS devices 1A and 1B which are of the same conductive type (for example both are NMOS). The structures of MOS devices 1A and 1B are similar but differ in the thickness of the gate dielectric layers 138A and 138B (for example, as shown in the figure, the thickness of the gate dielectric layer 138B of the MOS device 1B is thicker), such that the threshold voltages of the MOS devices 1A and 1B are different.

FIG. 2 shows another prior art high voltage combo MOS device (MOS device 2) which includes MOS devices 2A and 2B. MOS devices 2A and 2B are different in that the doping concentrations of the first conductive type well regions 12A and 12B are different, such that the threshold voltages of the MOS devices 2A and 2B are different.

Both the prior art devices shown in FIGS. 1 and 2 have a drawback that extra masks and process steps are required (to define and manufacture dielectric layers with different thickness in FIG. 1 or well regions of the same conductive type but with different doping concentrations in FIG. 2), to form high voltage MOS devices of different threshold voltages, which will increase the manufacturing cost.

Compared to the prior art of FIGS. 1 and 2, according to the present invention, high voltage MOS devices of the same conductive type but having different threshold voltages can be formed in one substrate without extra masks and process steps. Therefore, the present invention has a reduced cost and better performance.

SUMMARY OF THE INVENTION

From one perspective, the present invention provides a high voltage depletion mode metal oxide semiconductor (MOS) device with an adjustable threshold voltage, which is formed in a substrate having a top surface and a bottom surface opposite to the top surface in a vertical direction; the high voltage depletion mode MOS device comprising: a well region with a first conductive type, which is formed in the substrate, and is located under the top surface and contacts the top surface in the vertical direction; a channel region with a second conductive type, which is formed in the well region, and is located under the top surface and contacts the top surface in the vertical direction, wherein the high voltage depletion mode MOS device is conductive when the channel region is not depleted, and the high voltage depletion mode MOS device is not conductive when the channel region is depleted; a connection region with the second conductive type, which is formed in the well region, and is located under the top surface and contacts the top surface in the vertical direction, and contacts the channel region in a lateral direction; a gate with the first conductive type, which is formed on the top surface, wherein in the vertical direction, the gate is stacked on and contacts the top surface, and is located above and contacts at least a portion of the channel region, wherein the gate is configured to operably control the channel region to be depleted or not depleted; a lightly doped diffusion region with the second conductive type, which is formed in the well region, and is located under the top surface and contacts the top surface in the vertical direction, and is located right below a spacer of the gate, and contacts the channel region in the lateral direction; a source region with the second conductive type, which is formed in the well region, and is located under the top surface and contacts the top surface in the vertical direction, and contacts the lightly doped diffusion region in a lateral direction; and a drain region with the second conductive type, which is formed in the well region, and is located under the top surface and contacts the top surface in the vertical direction, and contacts the connection region in the lateral direction, but is away from the gate by a lateral distance, wherein the doping concentration of the connection region is lower than the doping concentration of the drain region; wherein the gate includes impurities with the first conductive type or impurities with both the first conductive type and the second conductive type, and a net doping concentration of the gate is determined according to a target threshold voltage.

In one embodiment, another high voltage MOS device is formed in the substrate, wherein a well region with the first conductive type, a source region with the second conductive type, and a drain region with the second conductive type of said another high voltage MOS device are formed by same process steps for forming the high voltage depletion mode MOS device, and said another high voltage MOS device includes a gate with the second conductive type.

In one embodiment, the high voltage depletion mode MOS device further includes a field oxide region which is formed on the top surface and is stacked on a portion of the connection region, wherein a portion of the gate with the first conductive type which is closer to the drain region than the source region in the lateral direction is stacked above and contacts at least a portion of the field oxide region in the vertical direction.

From another perspective, the present invention provides a manufacturing method of a high voltage depletion mode metal oxide semiconductor (MOS) device, comprising: providing a substrate having a top surface and a bottom surface opposite to the top surface in a vertical direction; forming a well region with a first conductive type in the substrate, wherein the well region is located under the top surface and contacts the top surface in the vertical direction; forming a channel region with a second conductive type in the well region, wherein the channel region is located under the top surface and contacts the top surface in the vertical direction, wherein the high voltage depletion mode MOS device is conductive when the channel region is not depleted, and the high voltage depletion mode MOS device is not conductive when the channel region is depleted; forming a connection region with the second conductive type in the well region, wherein the connection region is located under the top surface and contacts the top surface in the vertical direction, and contacts the channel region in a lateral direction; forming a gate with the first conductive type on the top surface, wherein in the vertical direction, the gate is stacked on and contacts the top surface, and is located above and contacts at least a portion of the channel region, wherein the gate is configured to operably control the channel region to be depleted or not depleted; forming a lightly doped diffusion region with the second conductive type in the well region, wherein the lightly doped diffusion region is located under the top surface and contacts the top surface in the vertical direction, and is located right below a spacer of the gate with the first conductive type, and contacts the channel region in the lateral direction; forming a source region with the second conductive type in the well region, wherein the source region is located under the top surface and contacts the top surface in the vertical direction, and contacts the lightly doped diffusion region; and forming a drain region with the second conductive type in the well region, wherein the drain region is located under the top surface and contacts the top surface in the vertical direction, and contacts the connection region in the lateral direction, but is away from the gate by a lateral distance, wherein the doping concentration of the connection region is lower than the doping concentration of the drain region; wherein the gate includes impurities with the first conductive type or impurities with both the first conductive type and the second conductive type, and a net doping concentration of the gate is determined according to a target threshold voltage.

In one embodiment, another high voltage MOS device is formed in the substrate, wherein a well region with the first conductive type, a source region with the second conductive type, and a drain region with the second conductive type of said another high voltage MOS device are formed by same process steps for forming the high voltage depletion mode MOS device, and said another high voltage MOS device includes a gate with the second conductive type.

In one embodiment, the gate is formed by a same lithography step and a same ion implantation step which form a source region with the first conductive type or a drain region with the first conductive type of another transistor device in the substrate.

In one embodiment, the manufacturing method of the high voltage depletion mode MOS device further includes: forming a field oxide region on the top surface, wherein the field oxide region is stacked on a portion of the connection region, and a portion of the gate with the first conductive type which is closer to the drain region than the source region in the lateral direction is stacked above and contacts at least a portion of the field oxide region in the vertical direction.

The objectives, technical details, features, and effects of the present invention will be better understood with regard to the detailed description of the embodiments below.

BRIEF DESCRIPTION OF THE DRAWINGS

FIGS. 6A-6I show schematic diagrams of cross sectional view of an embodiment of a manufacturing method of the high voltage depletion mode MOS device with adjustable threshold voltage according to the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
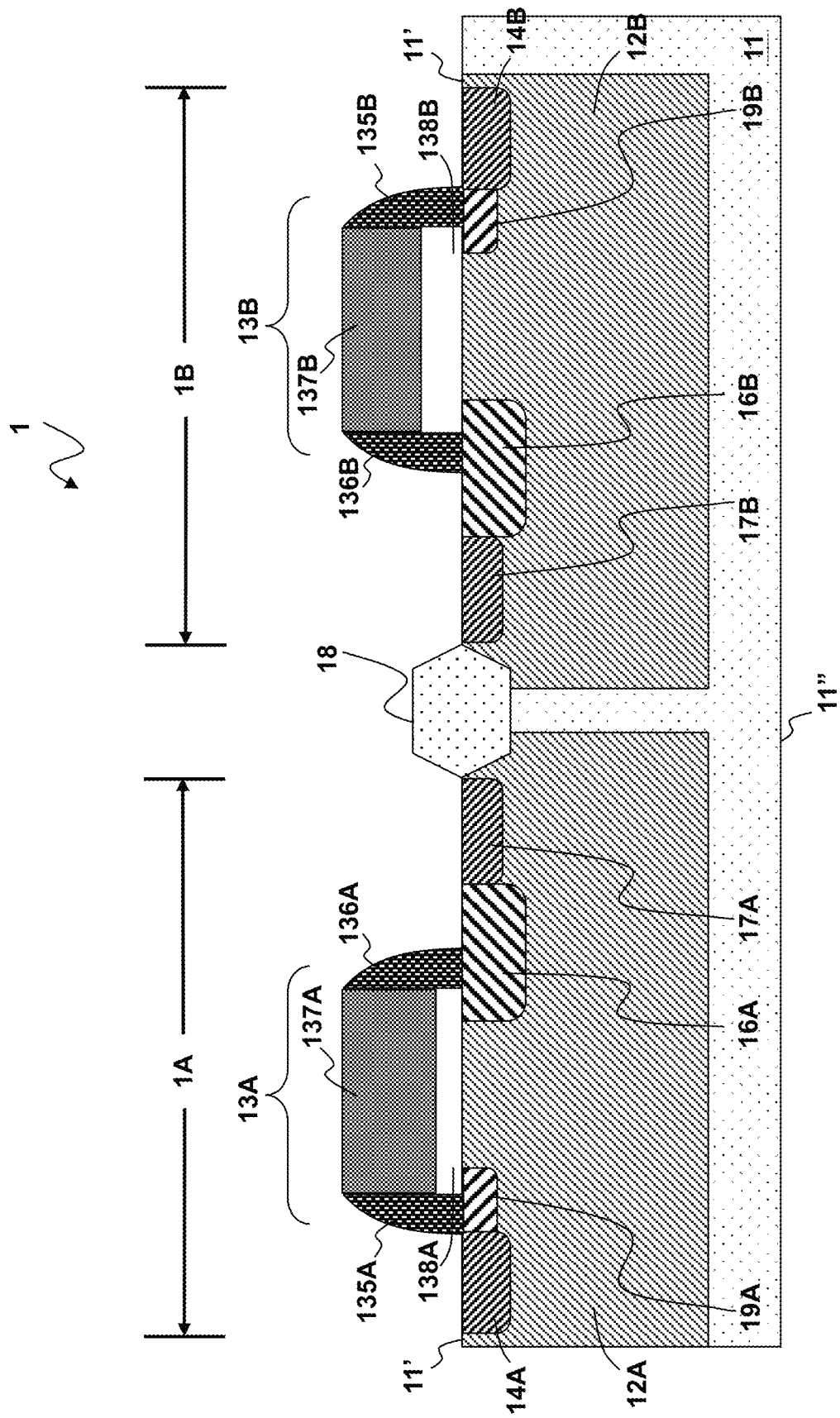
FIG. 1 shows a schematic diagram of a cross sectional view of a prior art MOS device.
Figure 2:
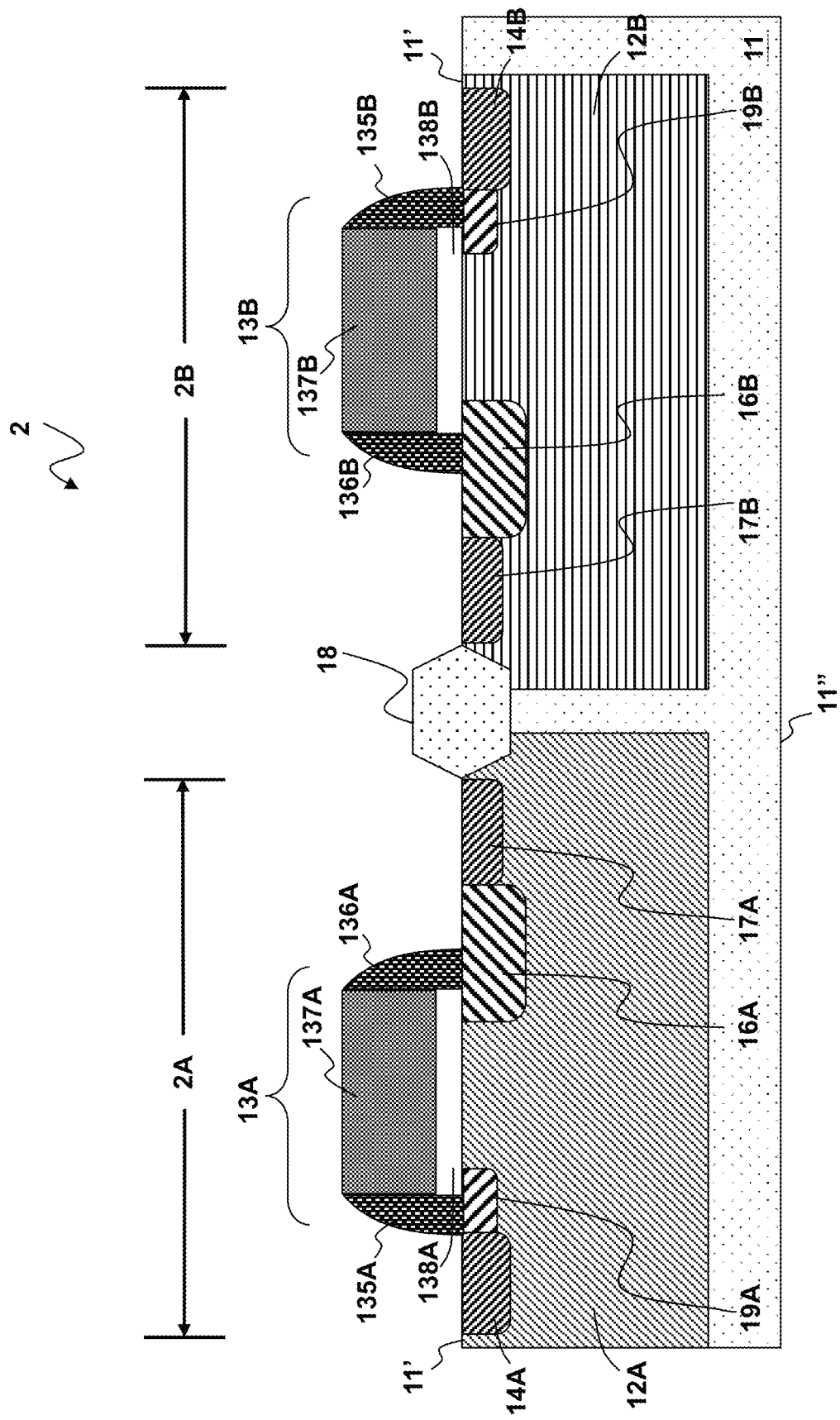
FIG. 2 shows a schematic diagram of a cross sectional view of another prior art MOS device.
Figure 3:
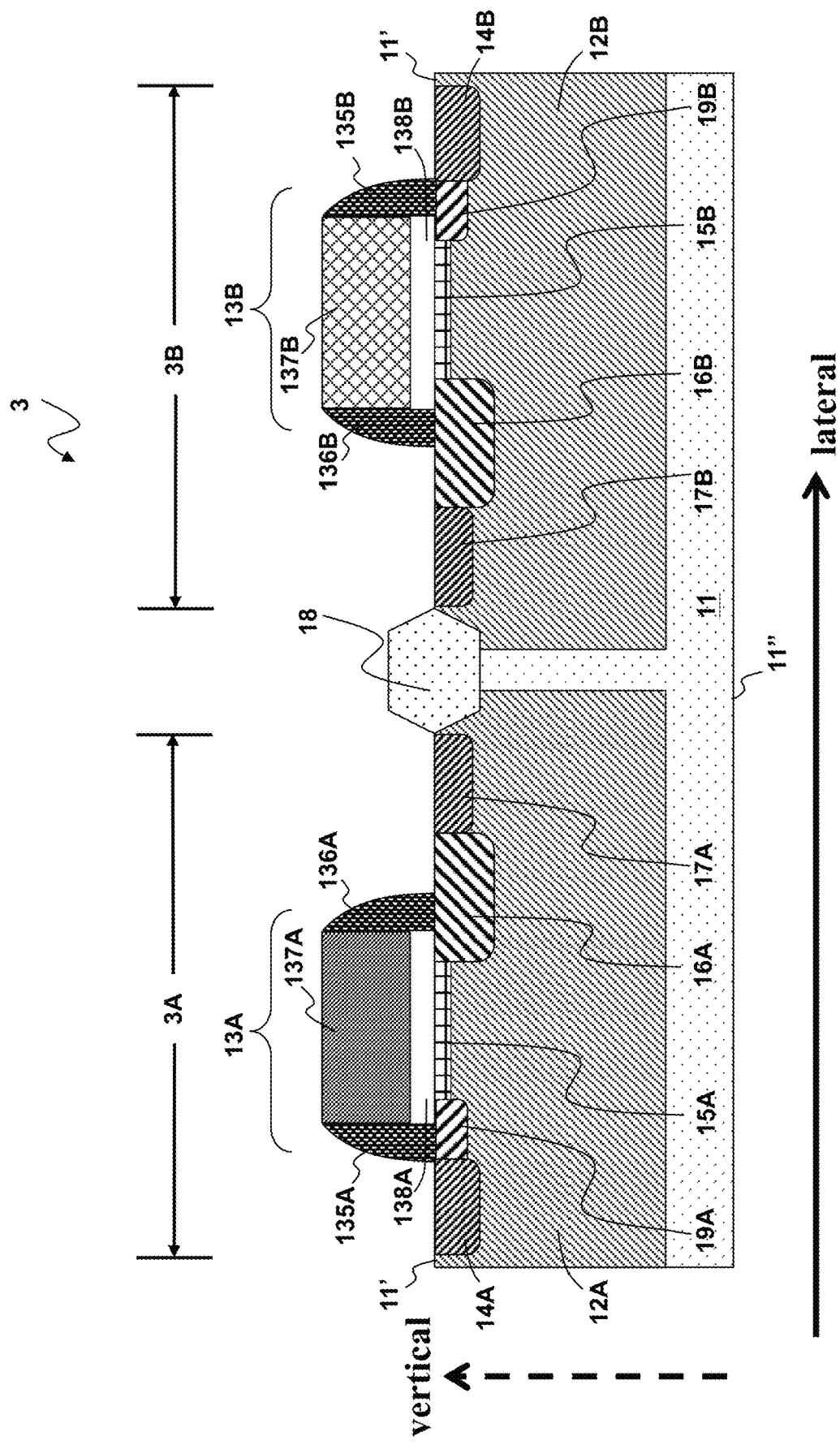
FIG. 3 shows a schematic diagram of a cross sectional view of an embodiment of a high voltage depletion mode MOS device with adjustable threshold voltage according to the present invention.

FIG. 3 shows a schematic diagram of an embodiment of a high voltage depletion mode MOS device with adjustable threshold voltage according to the present invention. FIG. 3 show two examples of the MOS devices (high voltage MOS devices 3A and 3B) to illustrate that two such devices can be manufactured in one substrate without extra masks and process steps. Both the MOS devices 3A and 3B are depletion mode high voltage MOS devices. The high voltage depletion mode MOS devices 3A and 3B are formed in a same semiconductor substrate 11 which includes a top surface 11' and a bottom surface 11" opposite to the top surface 11' in a vertical direction (as indicated by the dashed arrow shown in FIG. 3). The high voltage depletion mode MOS devices 3A and 3B respectively comprise: well regions 12A and 12B with a first conductive type, channel regions 15A and 15B with a second conductive type, connection regions 16A and 16B with the second conductive type, gates 13A and 13B, lightly doped diffusion regions 19A and 19B with the second conductive type, source regions 14A and 14B with the second conductive type, and drain regions 17A and 17B with the second conductive type.

The "first conductive type" and the "second conductive type" indicate impurities of different conductive types doped into regions such as the aforementioned well region, channel region, connection region, source region, drain region and gate; the first conductive type is for example N type and the second conductive type is for example P type, or the opposite.

Still referring to FIG. 3, well regions 12A and 12B with the first conductive type are formed in the semiconductor substrate 11, and are located under the top surface 11' and contact the top surface 11' in the vertical direction. In one embodiment, the well regions 12A and 12B may contact each other. In other words, the high voltage depletion mode MOS devices 3A and 3B may be formed in a same well region.

Channel regions 15A and 15B with the second conductive type are formed in the well regions 12A and 12B respectively, and are located under the top surface 11' and contact the top surface 11' in the vertical direction, wherein the high voltage depletion mode MOS device 3A is conductive when the channel region 15A is not depleted, and the high voltage depletion mode MOS device 3A is not conductive when the channel region 15A is depleted; and wherein the high voltage depletion mode MOS device 3B is conductive when the channel region 15B is not depleted, and the high voltage depletion mode MOS device 3B is not conductive when the channel region 15B is depleted.

Connection regions 16A and 16B with the second conductive type are formed in the well regions 12A and 12B respectively, and are located under the top surface 11' and contact the top surface 11' in the vertical direction, and contact the channel regions 15A and 15B respectively in a lateral direction (as indicated by the solid arrow noted "lateral", the same hereinafter).

Gates 13A and 13B are formed on the top surface 11', wherein in the vertical direction, the gates 13A and 13B are stacked on and contact the top surface 11', and are located above and contact at least a portion of the channel regions 15A and 15B respectively, wherein the gate 13A is configured to operably control the channel region 15A to be depleted or not depleted, and the gate 13B is configured to operably control the channel region 15B to be depleted or not depleted.

Lightly doped diffusion regions 19A and 19B with the second conductive type are formed in the well regions 12A and 12B respectively, and are located under the top surface 11' and contact the top surface 11' in the vertical direction. The lightly doped diffusion regions 19A and 19B are located right below spacers 135A and 135B of the gates 13A and 13B respectively, and contact the channel regions 15A and 15B respectively in the lateral direction to avoid OFF-channel when the high voltage depletion mode MOS devices 3A and 3B are controlled to be conductive, and the short channel effect can also be improved thereby. "Right below spacers 135A and 135B" means that viewing from a direction perpendicular to the semiconductor substrate 11, the spacers 135A and 135B are within the areas of the lightly doped diffusion regions 19A and 19B.

Source regions 14A and 14B with the second conductive type are formed in the well regions 12A and 12B respectively, and are located under the top surface 11' and contact the top surface 11' in the vertical direction, and contact the lightly doped diffusion region 19A and 19B respectively in the lateral direction. Drain regions 17A and 17B with the second conductive type are formed in the well regions 12A and 12B respectively, and are located under the top surface 11' and contact the top surface 11' in the vertical direction, and contact the connection regions 16A and 16B respectively in the lateral direction, wherein the doping concentrations of the connection regions 16A and 16B are lower than the doping concentrations of the drain regions 17A and 17B respectively. The drain regions 17A and 17B are away from the gates 13A and 13B by a lateral distance respectively; that is, viewing from a direction perpendicular to the semiconductor substrate 11, the drain regions 17A and 17B do not contact the gates 13A and 13B respectively.

In one embodiment, the gate 13A of the high voltage depletion mode MOS device 3A is doped with impurities of the second conductive type, and the gate 13B of the high voltage depletion mode MOS device 3B is doped with impurities of the first conductive type. The work functions of the high voltage depletion mode MOS devices 3A and 3B are different due to different types of doping in gates 13A and 13B, and therefore the high voltage depletion mode MOS devices 3A and 3B may have different threshold voltages. In other words, high voltage depletion mode MOS devices of the same conductive type but with different threshold voltages can be formed in one same substrate according to the present invention.

The aforementioned "high voltage" MOS device indicates that the voltage applied on the drain is higher than a certain level such as 5V or higher. Typically, high voltage MOS devices include connection regions (e.g. 16A and 16B as shown in FIG. 3) between the drain regions (e.g. 17A and 17B as shown in FIG. 3) and the gates (e.g. 13A and 13B as shown in FIG. 3), i.e., the drain regions and the gates are separated by the connection regions. The lateral length of the connection regions can be adjusted depending on the operating voltage required for the high voltage MOS device to operate with. Besides, the high voltage depletion mode MOS device 3A can be replaced by an enhancement mode MOS device, which should also fall within the scope of the present invention.

Figure 4:
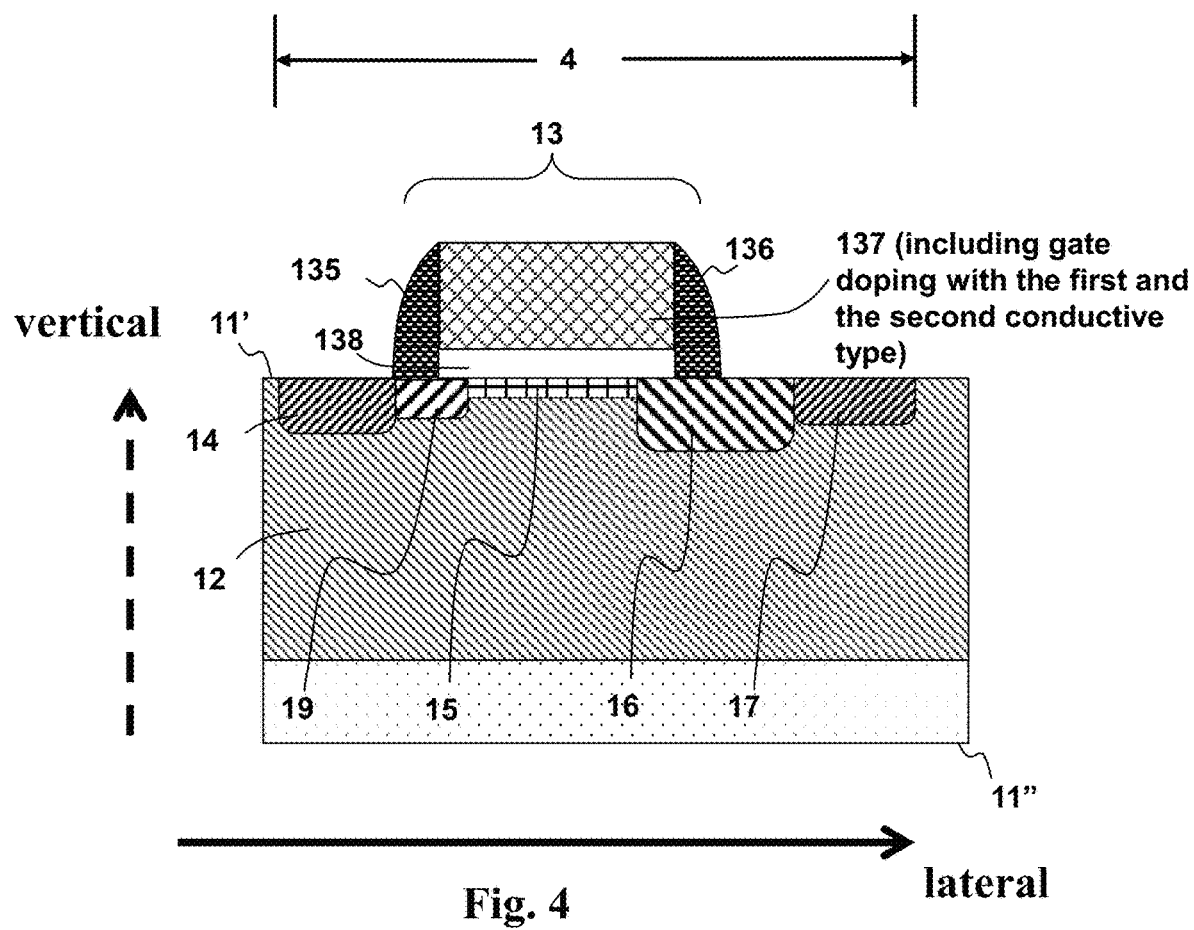
FIG. 4 shows a schematic diagram of a cross sectional view of an embodiment of a high voltage depletion mode MOS device with adjustable threshold voltage according to the present invention.

In one embodiment according to the present invention, a gate of a high voltage depletion mode MOS device can be doped with different types of impurities. Referring to FIG. 4 which shows a schematic diagram of a cross sectional view of an embodiment of the high voltage depletion mode MOS device (high voltage depletion mode MOS device 4) according to the present invention, the MOS device 4 is similar to the aforementioned high voltage depletion mode MOS device 3B but with a difference that the gate conduction layer 137 of the high voltage depletion mode MOS device 4 is doped with impurities of both the first and the second conductive types, and the net doping (i.e. net concentration) of the gate conduction layer 137 is the first conductive type. Note that the doping concentrations of the first and the second conductive types in the gate can be adjusted according to requirements (e.g. target threshold voltages), so the threshold voltage of the high voltage depletion mode MOS device 4 can be adjusted more flexibly. Besides, in one preferred embodiment, the gate conduction layer 137 with impurities of both the first and the second conductive types does not include any apparent interface of the first conductive type and the second conductive type impurities (e.g. P-N junction) in the lateral direction, the vertical direction and a width direction.

According to the present invention, the threshold voltage of the high voltage depletion mode MOS device is adjustable by doping with different conductive types or concentrations; hence, plural high voltage depletion mode MOS devices of the same conductive type but with different threshold voltages can be formed in a same substrate, and the design flexibility of high voltage circuitry is greatly improved. Standard process steps and masks for manufacturing a typical high voltage depletion mode MOS device, without extra masks and process steps, are sufficient to manufacture the MOS devices according to the present invention, with the adjustable threshold voltage; therefore, the cost is lower in comparison with the prior art. The manufacturing steps will be described in detail later.

Figure 5:
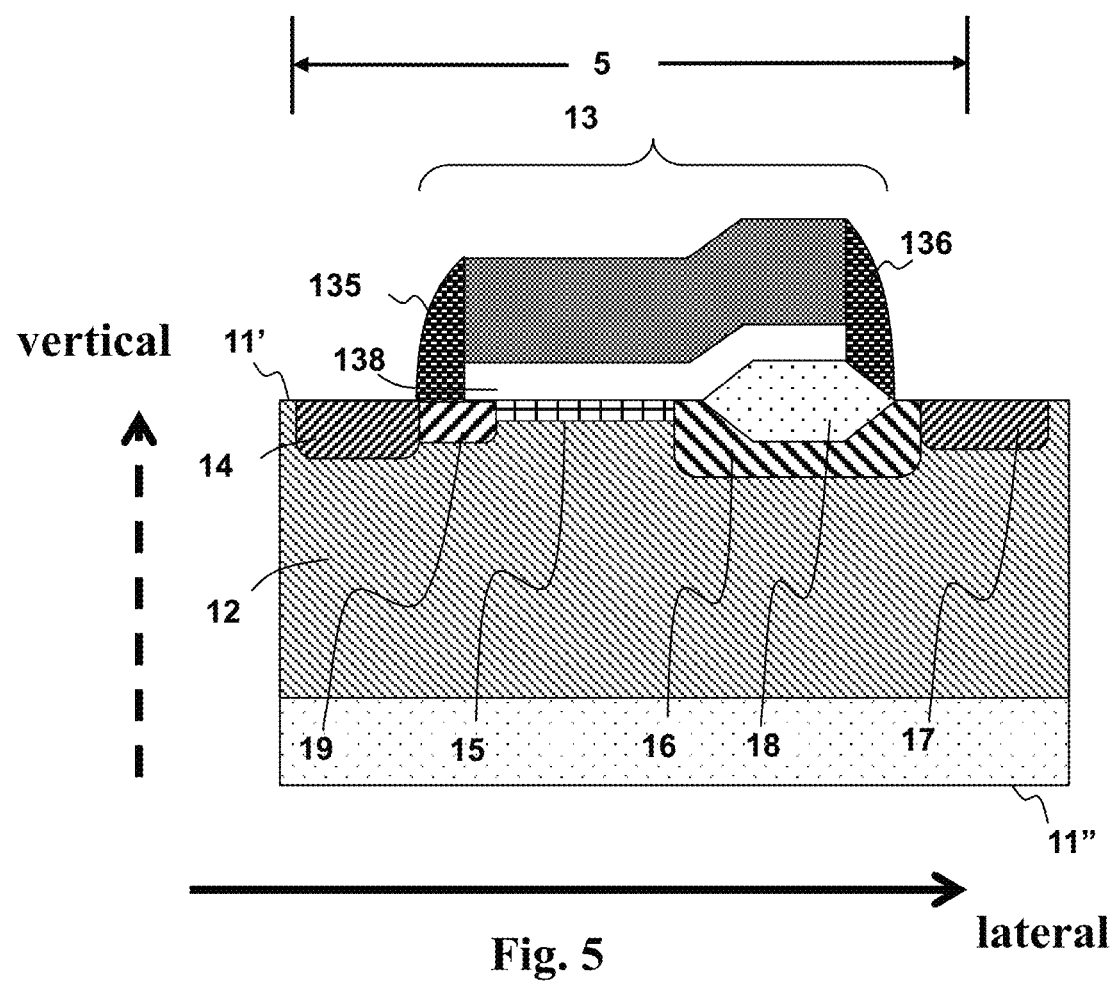
FIG. 5 shows a schematic diagram of a cross sectional view of an embodiment of a high voltage depletion mode MOS device with adjustable threshold voltage according to the present invention.

Referring to FIG. 5 which shows a schematic diagram of a cross sectional view of an embodiment of the high voltage depletion mode MOS device (high voltage depletion mode MOS device 5) according to the present invention. The MOS device 5 is similar to the aforementioned high voltage depletion mode MOS device 3B or 4 but with a difference that the high voltage depletion mode MOS device 5 further includes a field oxide region 18 which is formed on the top surface 11' and is stacked on a portion of the connection region 16, wherein a portion of the gate 13 with the first conductive type which is closer to the drain region 17 than the source region 14 in the lateral direction is stacked above and contacts at least a portion of the field oxide region 18 in the vertical direction. In this embodiment shown in FIG. 5, the portion of the gate 13 which is closer to the drain region 17 than the source region 14 in the lateral direction is stacked above and contacts the whole of the field oxide region 18 in the vertical direction. This embodiment illustrates that the teaching of the present invention can be applied in various kinds of high voltage depletion mode MOS devices such as one with field oxide region 18, or other kinds. Since the high voltage depletion mode MOS device 5 includes the field oxide region 18, the operating voltage can be higher. Besides, the field oxide region 18 is not limited to the local oxidation of silicon (LOCOS) structure as shown in the figure, and may be embodied with a shallow trench isolation (STI) structure.

Figure 6A:
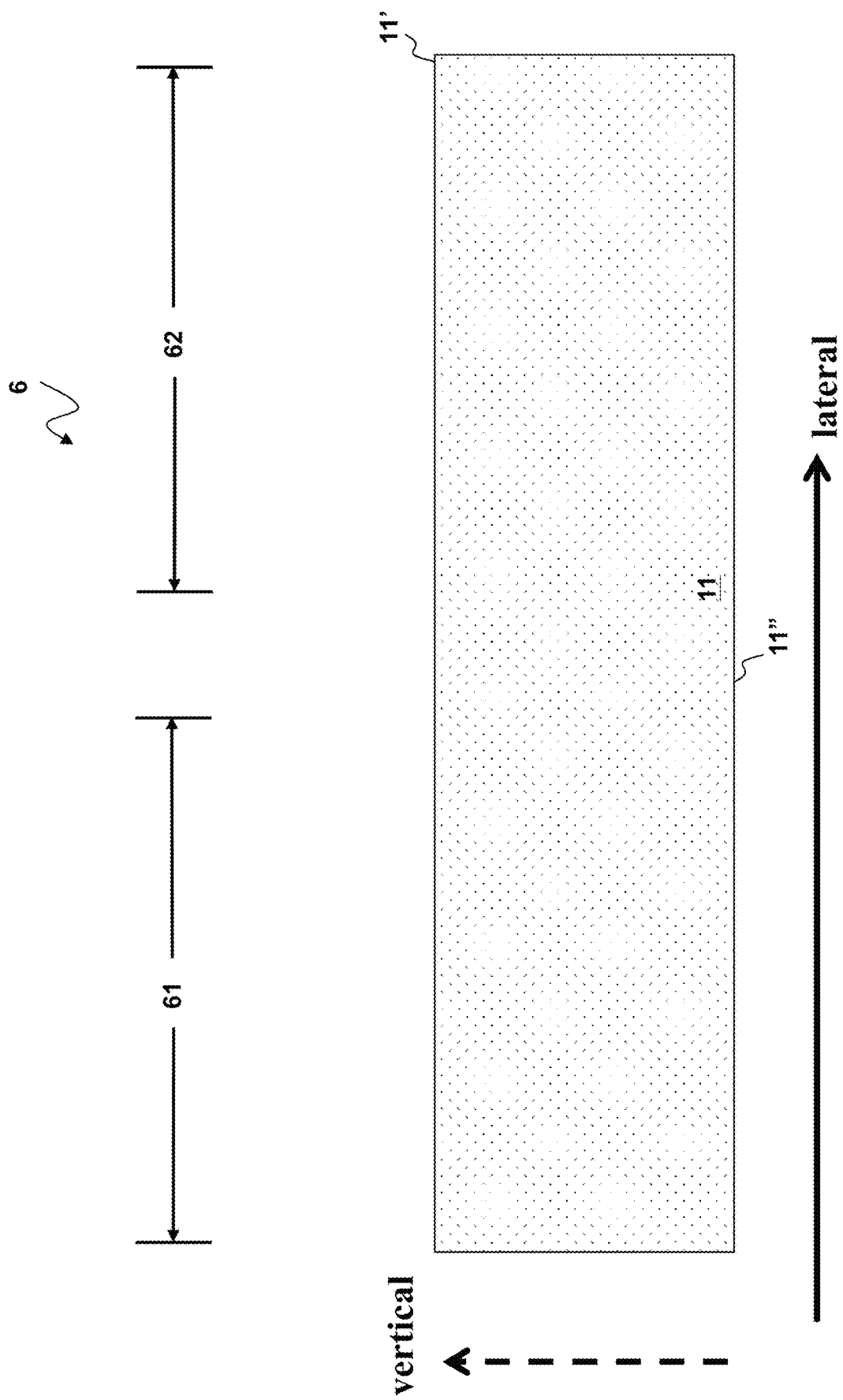
Figure 6B:
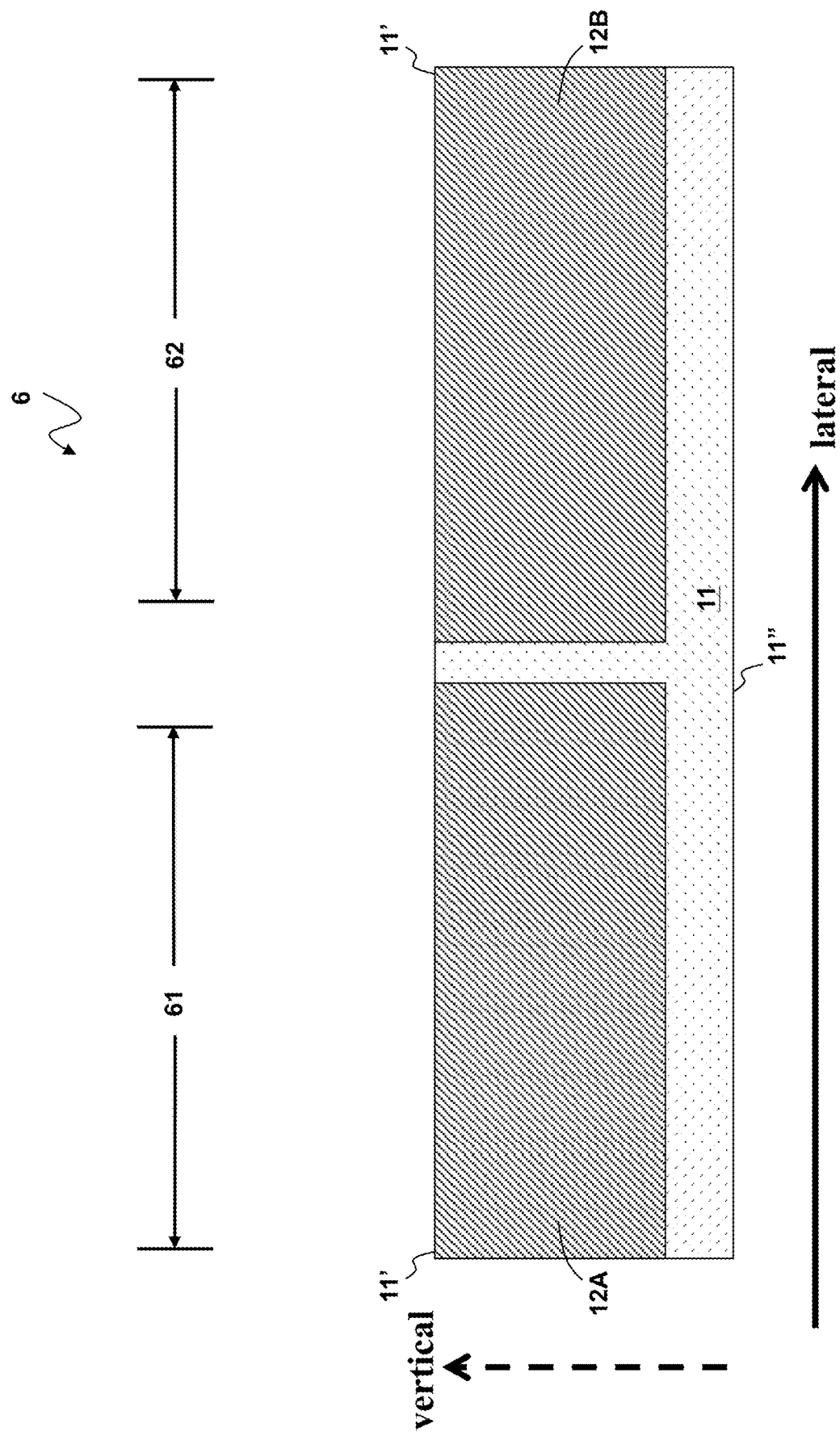

FIGS. 6A-6I" show schematic diagrams, in cross sectional views, of a manufacturing method of a high voltage MOS depletion mode device with adjustable threshold voltage (high voltage depletion mode MOS device 6, including 61 and 62) according to the present invention. First, as shown in FIG. 6A, a semiconductor substrate 11 is provided, wherein the semiconductor substrate 11 is for example but not limited to a P type silicon substrate, but certainly it may be other types of semiconductor substrate. The semiconductor substrate 11 includes a top surface 11' and a bottom surface 11" opposite to the top surface 11' in a vertical direction (as indicated by the dashed arrow as shown in the figure). Next, as shown in FIG. 6B, well regions 12A and 12B with the first conductive type are formed in the semiconductor substrate 11, which are located under the top surface 11' and contact the top surface 11' in the vertical direction. In one embodiment, the well regions 12A and 12B may be formed by for example but not limited to lithography, ion implantation, and thermal process steps. In one embodiment, the well regions 12A and 12B may contact each other. In other words, the high voltage depletion mode MOS devices 61 and 62 may be formed in a same well region.

Next, as shown in FIG. 6C, a field oxide region 18 is formed to define an active region of the high voltage depletion mode MOS devices 61 and 62, wherein gates 13A and 13B, source regions 14A and 14B with the second conductive type, channel regions 15A and 15B with a second conductive type, connection regions 16A and 16B with the second conductive type, drain regions 17A and 17B with the second conductive type, and lightly doped diffusion regions 19A and 19B with the second conductive type are all formed later in the active region of the high voltage depletion mode MOS devices 61 and 62 respectively. The field oxide region 18 is not limited to the local oxidation of silicon (LOCOS) structure as shown in the figure, and may be embodied with a shallow trench isolation (STI) structure.

Figure 6D:
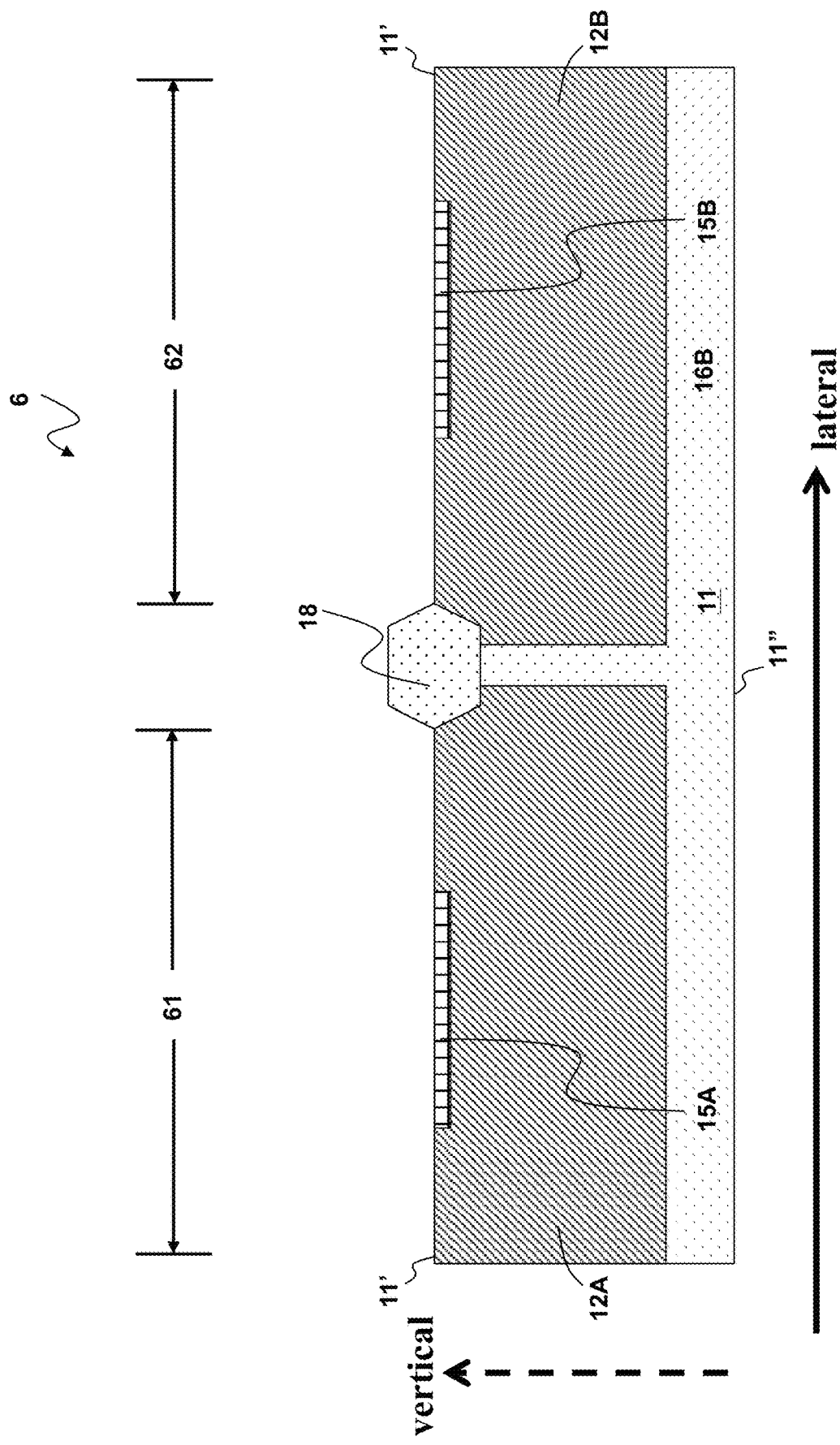

Next, as shown in FIG. 6D, channel regions 15A and 15B with the second conductive type are formed in the well regions 12A and 12B respectively, which are located under the top surface 11' and contact the top surface 11' in the vertical direction, wherein the high voltage depletion mode MOS devices 61 is conductive when the channel region 15A is not depleted, and the high voltage depletion mode MOS device 61 is not conductive when the channel region 15A is depleted; and wherein the high voltage depletion mode MOS devices 62 is conductive when the channel region 15B is not depleted, and the high voltage depletion mode MOS device 62 is not conductive when the channel region 15B is depleted.

Figure 6E:
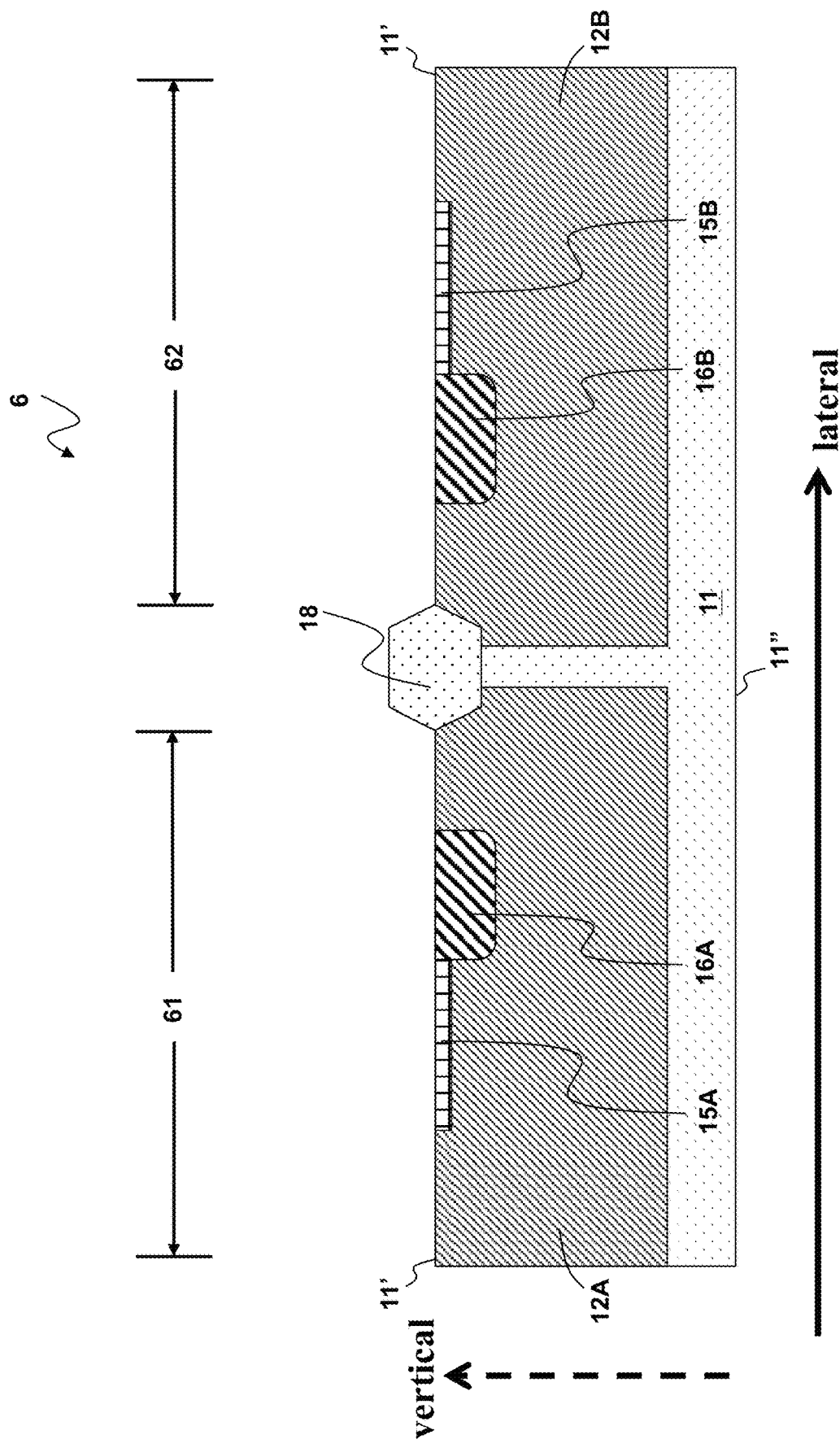

Next, as shown in FIG. 6E, connection regions 16A and 16B with the second conductive type are formed in the well regions 12A and 12B respectively, which are located under the top surface 11' and contact the top surface 11' in the vertical direction, and contact the channel regions 15A and 15B respectively in a lateral direction.

Figure 6F:
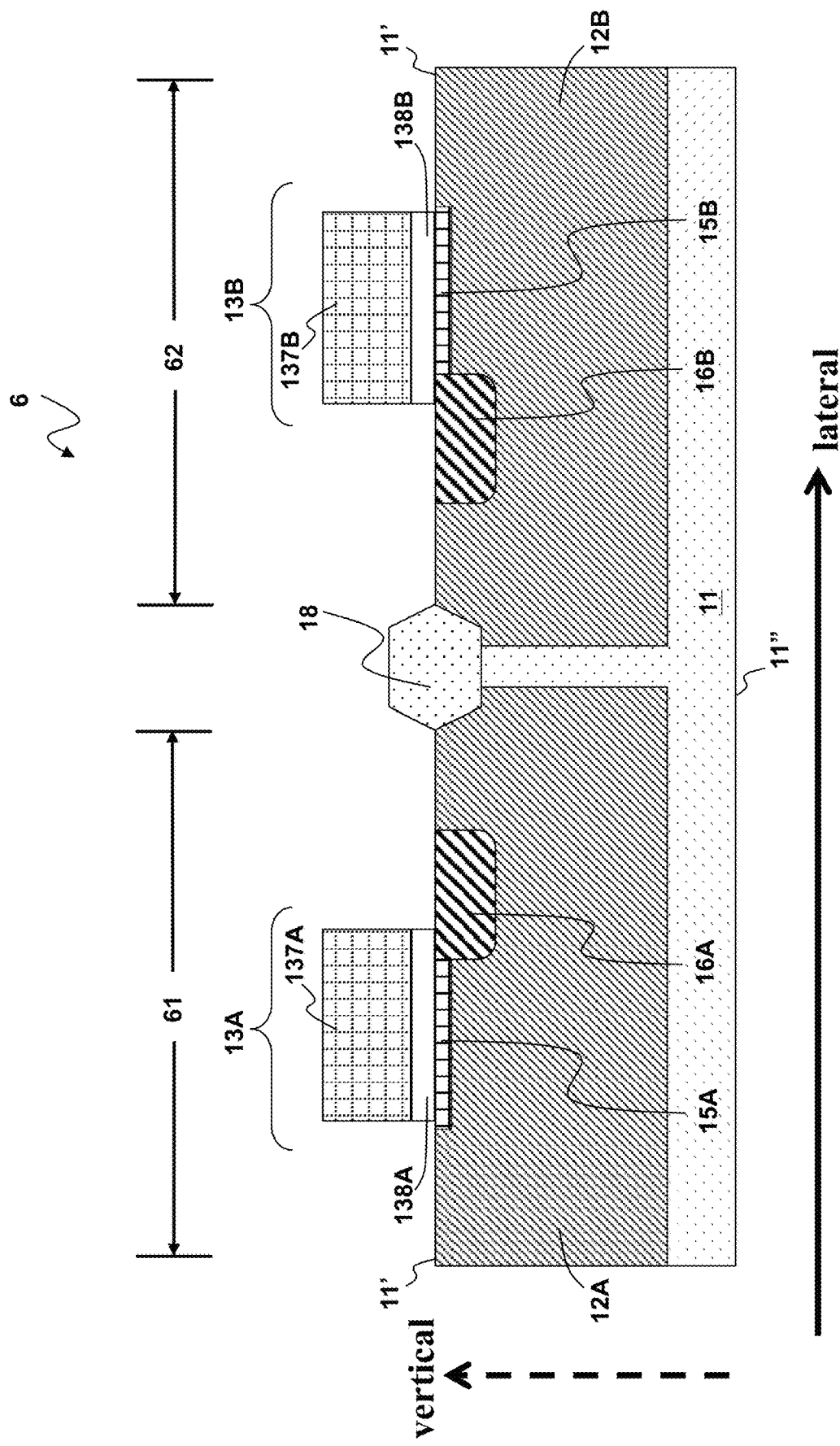

Next, as shown in FIG. 6F, gates 13A and 13B are formed on the top surface 11', wherein in the vertical direction, the gates 13A and 13B are stacked and contact the top surface 11', and are located above and contact at least a portion of the channel regions 15A and 15B respectively, wherein the gate 13A is configured to operably control the channel region 15A to be depleted (i.e. not conductive) or not depleted (i.e. conductive), and the gate 13B is configured to operably control the channel region 15B to be depleted (i.e. not conductive) or not depleted (i.e. conductive).

Figure 6G:
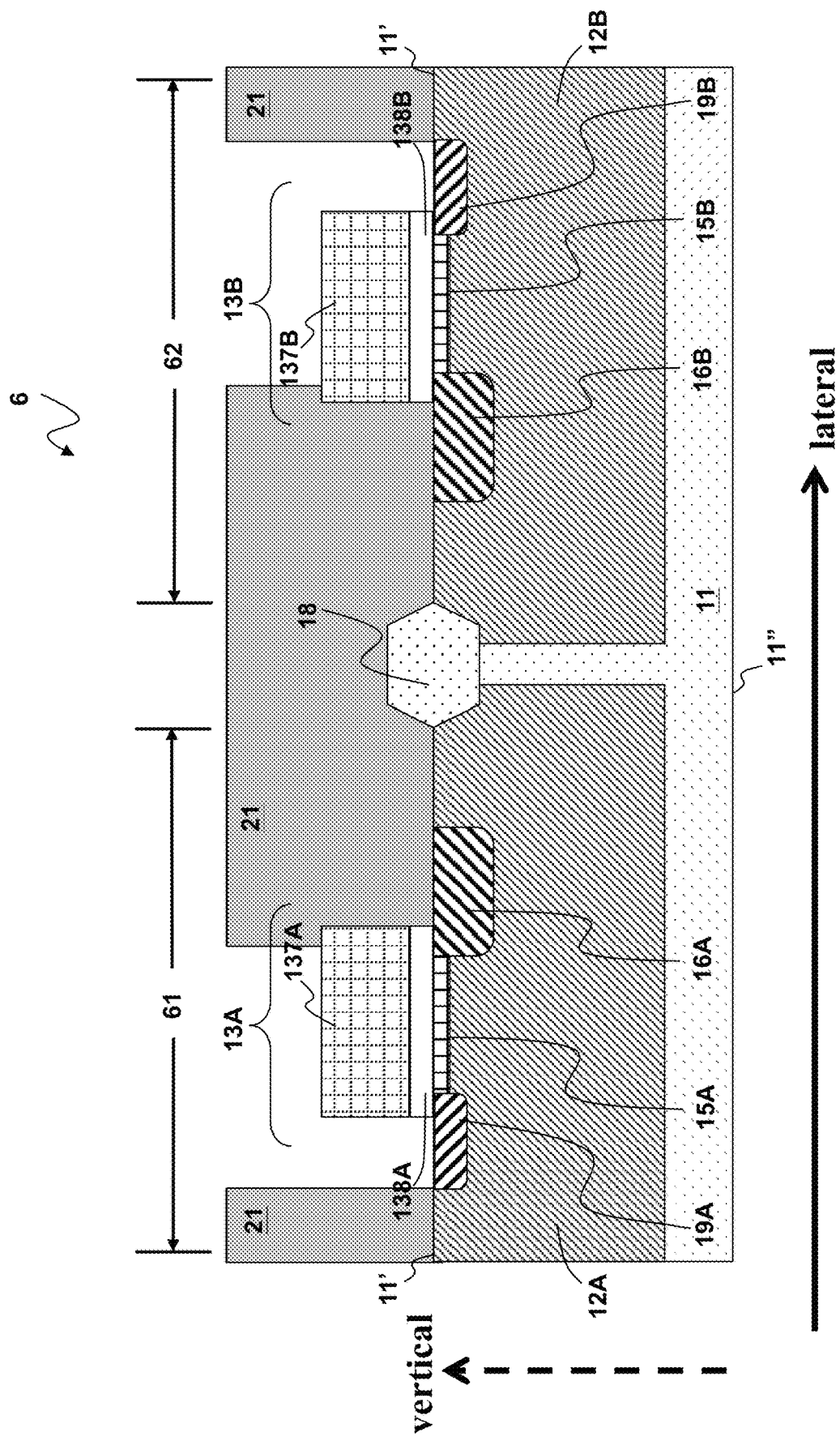

Next, as shown in FIG. 6G, dielectric layers 138A and 138B, gate conduction layers 137A and 137B and a photoresist layer 21 define an ion implantation region of the lightly doped diffusion regions 19A and 19B. An ion implantation process is performed to implant impurities with the second conductive type into the defined region to form the lightly doped diffusion regions 19A and 19B with the second conductive type, wherein the lightly doped diffusion regions 19A and 19B contact the channel regions 15A and 15B respectively in the lateral direction.

Figure 6H:
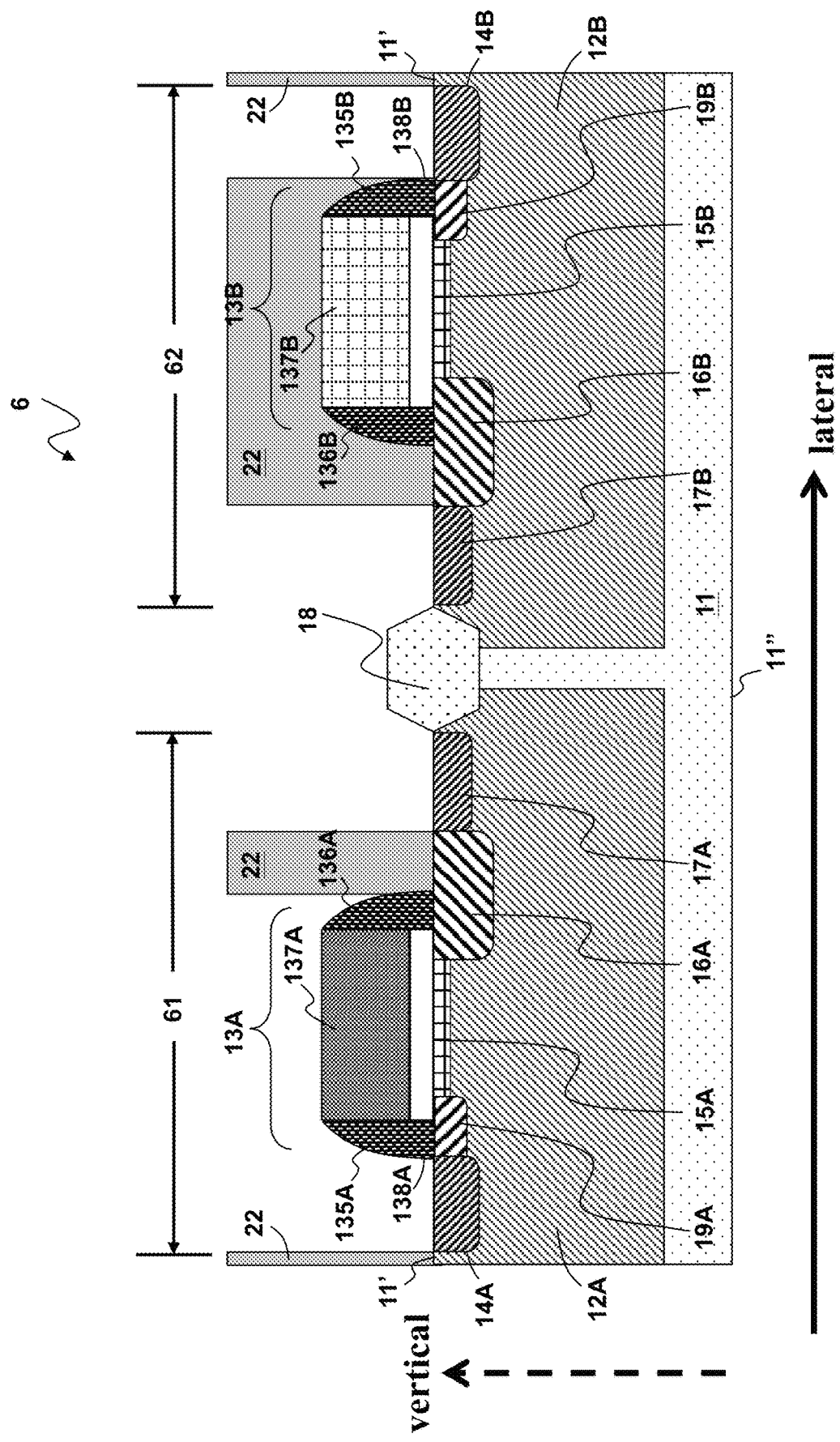

Next, as shown in FIG. 6H, the gate 13A, the field oxide region 18, and a photoresist layer 22 define an ion implantation region of the source regions 14A and 14B and drain regions 17A and 17B. An ion implantation process is performed to implant impurities with the second conductive type into the defined region to form source regions 14A and 14B and drain regions 17A and 17B with the second conductive type. Source regions 14A and 14B contact the lightly doped diffusion regions 19A and 19B respectively in the lateral direction. Drain regions 17A and 17B contact the connection regions 16A and 16B respectively in the lateral direction. Viewing from a direction perpendicular to the semiconductor substrate 11, the drain region 17A does not contact the gate 13A and the drain region 17B does not contact the gate 13B (the drain regions 17A and 17B are away from the gates 13A and 13B by a lateral distance respectively), such that the high voltage depletion mode MOS device 61 and 62 may operate with a higher voltage.

Note that in this embodiment, the doping of the gate 13A with the second conductive type is also formed in this step. In another embodiment, the doping of the gate 13A with the second conductive type may be formed in a step other than that for forming the source regions 14A and 14B and drain regions 17A and 17B with the second conductive type, wherein the doping concentration or other parameters for forming the gate 13A with the second conductive type may be different from that for forming the source regions 14A and 14B and drain regions 17A and 17B with the second conductive type.

In one embodiment, the ion implantation regions of the channel regions 15A and 15B with the second conductive type may be defined by a mask so that the channel region 15A contacts the lightly doped diffusion region 19A and the connection region 16A but does not contact the source region 14A and the drain region 17A, and the channel region 15B contacts the lightly doped diffusion regions 19B and the connection region 16B but does not contact the source region 14B and the drain region 17B, such that the high voltage depletion mode MOS device according to the present invention may operate with a higher voltage. In another embodiment, the ion implantation regions of the channel regions 15A and 15B with the second conductive type are not defined by a mask, to reduce cost. In this case, a part of the channel region 15A may overlap a part of the lightly doped diffusion region 19A, a part of the connection region 16A, a part of the source region 14A, and a part of the drain region 17A; and, a part of the channel region 15B may overlap a part of the lightly doped diffusion region 19B, a part of the connection region 16B, a part of the source region 14B, and a part of the drain region 17B.

Figure 6I:
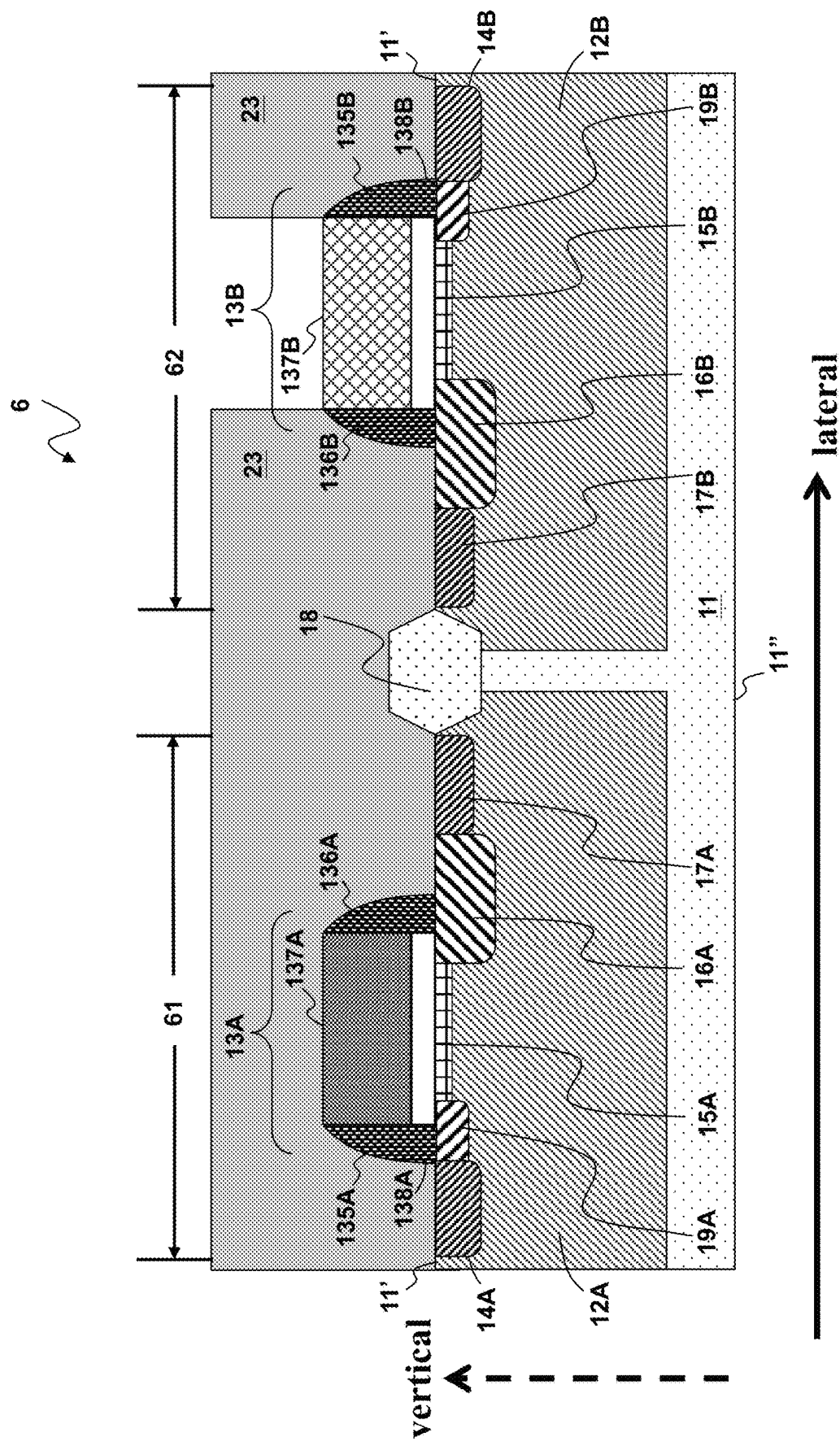

Next, as shown in FIG. 6I, a photoresist layer 23 is formed to define an ion implantation region of the gate 13B with the first conductive type. An ion implantation process is performed to implant impurities with the first conductive type into the defined region to form the gate 13B with the first conductive type doping. In one embodiment, the impurities with the first conductive type may be doped into the gate 13B in the same step of forming a source region with the first conductive type or a drain region with the first conductive type of another transistor device (for example a MOS device with the first conductive type) in the substrate 11. In this case, the mask number and process steps can be kept the same as a standard high voltage device manufacturing process, i.e., the process cost is not increased, while plural high voltage depletion mode MOS devices of the same conductive type but with different threshold voltages can be formed in a same substrate; with MOS devices of different threshold voltages, the design flexibility of high voltage circuitry is greatly improved. In another embodiment, the gate doping of the gate 13B with the first conductive type may be formed by a step other than that for forming the source region with the first conductive type or the drain region with the first conductive type of the another transistor device, and in this case the doping concentration or other parameters for forming the gate 13B with the first conductive type may be different from that of the source region with the first conductive type or the drain region with the first conductive type of the another transistor device.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, two or more high voltage depletion mode MOS devices with "gate doping with the first conductive type", "gate doping with the second conductive type", and "gate doping with both the first and the second conductive type" may be combined together, such that the high voltage depletion mode MOS devices according to the present invention may have combinations of high voltage depletion mode MOS devices of the same conductive type with various threshold voltages. Furthermore, those skilled in this art can readily conceive variations and modifications within the spirit of the present invention. For example, the present invention can be applied to other types of high voltage or low voltage MOS devices. As another example, the process steps or structures which do not affect the primary characteristic of the device, such as a buried layer, and etc; can be added; for another example, the lithography step described in the above can be replaced by electron beam lithography or other lithography techniques. In view of the foregoing, the spirit of the present invention should cover all such and other modifications and variations, which should be interpreted to fall within the scope of the following claims and their equivalents.

What is claimed is:

1. A high voltage depletion mode metal oxide semiconductor (MOS) device with an adjustable threshold voltage, which is formed in a substrate having a top surface and a bottom surface opposite to the top surface in a vertical direction; the high voltage depletion mode MOS device comprising:

a well region with a first conductive type, which is formed in the substrate, and is located under the top surface and contacts the top surface in the vertical direction;

a channel region with a second conductive type, which is formed in the well region, and is located under the top surface and contacts the top surface in the vertical direction, wherein the high voltage depletion mode MOS device is conductive when the channel region is not depleted, and the high voltage depletion mode MOS device is not conductive when the channel region is depleted;

a connection region with the second conductive type, which is formed in the well region, and is located under the top surface and contacts the top surface in the vertical direction, and contacts the channel region in a lateral direction;

a gate with the first conductive type, which is formed on the top surface, wherein in the vertical direction, the gate is stacked on and contacts the top surface, and is located above and contacts at least a portion of the channel region, wherein the gate is configured to operably control the channel region to be depleted or not depleted so as to control the channel region to be correspondingly non-conductive or conductive respectively, wherein the gate is doped with impurities of the first conductive type and a net doping concentration of the impurities of the gate is the first conductive type and the net doping concentration of the impurities of the gate determines a target threshold voltage of the high voltage depletion mode MOS device;

a lightly doped diffusion region with the second conductive type, which is formed in the well region, and is located under the top surface and contacts the top surface in the vertical direction, and is located right below a spacer of the gate, and contacts the channel region in the lateral direction;

a source region with the second conductive type, which is formed in the well region, and is located under the top surface and contacts the top surface in the vertical direction, and contacts the lightly doped diffusion region in a lateral direction; and a drain region with the second conductive type, which is formed in the well region, and is located under the top surface and contacts the top surface in the vertical direction, and contacts the connection region in the lateral direction, but is away from the gate by a lateral distance, wherein the doping concentration of the connection region is lower than the doping concentration of the drain region;

wherein the connection region has two ends in the lateral direction, wherein one end of the connection region is located right below the gate, and the other end of the connection region ends at an interface where the connection region contacts the drain, and the interface between the connection region and the drain is laterally away from the spacer of the gate by a lateral distance and a distance in the lateral direction between the two ends is defined by a photoresist instead of the spacer of the gate, such that a breakdown voltage between the gate to the drain region is higher than otherwise the net doping concentration of the impurities of the gate is the second conductive type;

wherein the first conductive type and the second conductive type are opposite conductive types and correspond to a P type and an N type, or to an N type and a P type.

2. The high voltage depletion mode MOS device of claim 1, wherein another high voltage MOS device is formed in the substrate, wherein a well region with the first conductive type, a source region with the second conductive type, and a drain region with the second conductive type of said another high voltage MOS device are formed by same process steps for forming the high voltage depletion mode MOS device, and said another high voltage MOS device includes a gate with the second conductive type.

3. The high voltage depletion mode MOS device of claim 1, further including a field oxide region which is formed on the top surface and is stacked on a portion of the connection region, wherein a portion of the gate with the first conductive type which is closer to the drain region than the source region in the lateral direction is stacked above and contacts at least a portion of the field oxide region in the vertical direction.

4. A manufacturing method of a high voltage depletion mode metal oxide semiconductor (MOS) device, comprising:

providing a substrate having a top surface and a bottom surface opposite to the top surface in a vertical direction;

forming a well region with a first conductive type in the substrate, wherein the well region is located under the top surface and contacts the top surface in the vertical direction;

forming a channel region with a second conductive type in the well region, wherein the channel region is located under the top surface and contacts the top surface in the vertical direction, wherein the high voltage depletion mode MOS device is conductive when the channel region is not depleted, and the high voltage depletion mode MOS device is not conductive when the channel region is depleted;

forming a connection region with the second conductive type in the well region, wherein the connection region is located under the top surface and contacts the top surface in the vertical direction, and contacts the channel region in a lateral direction;

forming a gate with the first conductive type on the top surface, wherein in the vertical direction, the gate is stacked on and contacts the top surface, and is located above and contacts at least a portion of the channel region, wherein the gate is configured to operably control the channel region to be depleted or not depleted so as to control the channel region to be correspondingly non-conductive or conductive respectively, wherein the gate is doped with impurities of the first conductive type and a net doping concentration of the impurities of the gate is the first conductive type and the net doping concentration of the impurities of the gate determines a target threshold voltage of the high voltage depletion mode MOS device;

forming a lightly doped diffusion region with the second conductive type in the well region, wherein the lightly doped diffusion region is located under the top surface and contacts the top surface in the vertical direction, and is located right below a spacer of the gate with the first conductive type, and contacts the channel region in the lateral direction;

forming a source region with the second conductive type in the well region, wherein the source region is located under the top surface and contacts the top surface in the vertical direction, and contacts the lightly doped diffusion region; and forming a drain region with the second conductive type in the well region, wherein the drain region is located under the top surface and contacts the top surface in the vertical direction, and contacts the connection region in the lateral direction, but is away from the gate by a lateral distance, wherein the doping concentration of the connection region is lower than the doping concentration of the drain region;

wherein the connection region has two ends in the lateral direction, wherein one end of the connection region is located right below the gate, and the other end of the connection region ends at an interface where the connection region contacts the drain, and the interface between the connection region and the drain is laterally away from the spacer of the gate by a lateral distance and a distance in the lateral direction between the two ends is defined by a photoresist instead of the spacer of the gate, such that a breakdown voltage between the gate to the drain region is higher than otherwise the net doping concentration of the impurities of the gate is the second conductive type;

wherein the first conductive type and the second conductive type are opposite conductive types and correspond to a P type and an N type, or to an N type and a P type.

5. The manufacturing method of claim 4, wherein another high voltage MOS device is formed in the substrate, wherein a well region with the first conductive type, a source region with the second conductive type, and a drain region with the second conductive type of said another high voltage MOS device are formed by same process steps for forming the high voltage depletion mode MOS device, and said another high voltage MOS device includes a gate with the second conductive type.

6. The manufacturing method of claim 4, wherein another MOS device is formed in the substrate, wherein a source region with the first conductive type or a drain region with the first conductive type of said another MOS device is doped with impurities of the first conductive type by a same lithography step and a same ion implantation step which dope impurities of the first conductive type to the gate.

7. The manufacturing method of claim 4, further including: forming a field oxide region on the top surface, wherein the field oxide region is stacked on a portion of the connection region, and a portion of the gate with the first conductive type which is closer to the drain region than the source region in the lateral direction is stacked above and contacts at least a portion of the field oxide region in the vertical direction.

* * * * *